(12) United States Patent
Braun et al.

(10) Patent No.: US 7,313,773 B1
(45) Date of Patent: Dec. 25, 2007

(54) METHOD AND DEVICE FOR SIMULATOR GENERATION BASED ON SEMANTIC TO BEHAVIORAL TRANSLATION

(75) Inventors: Gunnar Braun, Aachen (DE); Achim Nohl, Aachen (DE); Jianjiang Ceng, Aachen (DE); Andreas Hoffmann, Aachen (DE); Rainer Leupers, Dorsten (DE)

(73) Assignee: CoWare, Inc., San Jose, CA (US)

( * ) Notice: Subject to any disclaimer, the term of this patent is extended or adjusted under 35 U.S.C. 154(b) by 246 days.

(21) Appl. No.: 11/139,373

(22) Filed: May 26, 2005

Related U.S. Application Data

(60) Provisional application No. 60/574,794, filed on May 26, 2004.

(51) Int. Cl.
*G06F 17/50* (2006.01)
*G06F 9/45* (2006.01)
*G06F 9/455* (2006.01)

(52) U.S. Cl. .................. 716/5; 716/2; 716/3; 716/18; 717/104; 717/107; 717/135; 717/143

(58) Field of Classification Search ............... 716/5, 716/2, 3, 18; 717/104, 107, 135, 143
See application file for complete search history.

(56) References Cited

U.S. PATENT DOCUMENTS

| | | | |
|---|---|---|---|
| 5,933,641 A * | 8/1999 | Ma ........................... | 717/143 |
| 6,152,612 A * | 11/2000 | Liao et al. .................. | 703/23 |
| 6,467,082 B1 * | 10/2002 | D'Arcy et al. .............. | 717/127 |
| 6,606,588 B1 * | 8/2003 | Schaumont et al. .......... | 703/15 |
| 6,606,734 B2 * | 8/2003 | Greaves ....................... | 716/4 |
| 6,708,329 B1 * | 3/2004 | Whitehill et al. ........... | 717/136 |
| 7,006,960 B2 * | 2/2006 | Schaumont et al. .......... | 703/15 |
| 7,062,724 B2 * | 6/2006 | Nakajima ...................... | 716/1 |
| 7,065,719 B2 * | 6/2006 | Nakajima ...................... | 716/1 |
| 7,113,901 B1 * | 9/2006 | Schaumont et al. .......... | 703/14 |
| 7,155,690 B2 * | 12/2006 | Yamashita et al. ............ | 716/5 |
| 2003/0061580 A1 * | 3/2003 | Greaves ....................... | 716/4 |
| 2003/0126563 A1 * | 7/2003 | Nakajima ...................... | 716/1 |
| 2003/0200511 A1 * | 10/2003 | Nakajima ...................... | 716/1 |
| 2004/0123249 A1 * | 6/2004 | Sato et al. .................... | 716/1 |
| 2006/0190909 A1 * | 8/2006 | Nakajima .................... | 716/18 |
| 2006/0195812 A1 * | 8/2006 | Nakajima .................... | 716/18 |
| 2007/0157138 A1 * | 7/2007 | Ciolfi et al. .................. | 716/4 |

FOREIGN PATENT DOCUMENTS

EP 490478 A2 * 6/1992

OTHER PUBLICATIONS

NN8812170, "Simulation Technique for Analog Functions in a Mixed Analog and Digital Semiconductor Chip Design Environment", IBM Technical Disclosure Bulletin, vol. 31, No. 7, Dec. 1988, pp. 170-173 (5 pages).*

(Continued)

*Primary Examiner*—Phallaka Kik

(57) ABSTRACT

Generating a simulator from an architecture description. A target architecture model described in an architecture description language (ADL) is accessed. The model comprises a semantic representation of an instruction set for the target architecture. The semantic representation is translated to a behavioral representation. The simulator is automatically generated from the behavioral representation. A compiler may also be generated from the semantic representation.

22 Claims, 9 Drawing Sheets

OTHER PUBLICATIONS

NN87055229, "Testcase Pattern Generation for Design Verification Using a System Level Simulator", IBM Technical Disclosure Bulletin, vol. 29, No. 12, May 1987, pp. 5229-5232 (6 pages).*

Duncan et al., "The COBRA-ABS High-Level Synthesis System for Multi-FPGA Custom Computing Machines", IEEE Transactions on Very Large Scale Integration (VLSI) Systems, vol. 9, No. 1, Feb. 2001, pp. 218-223.*

Ernst et al., "TSG- a Test System Generator for Debugging and Regression Test of High-Level Behavioral Synthesis Tool", IEEE, 1989, p. 937.*

Bjornsen et al., "Behavioral Modeling and Simulations of High-Speed Analog-to-Digital Converters Using SystemC", IEEE, 2003, pp. III-906-909.*

Eileithy et al., "Synthesizing DSP Architectures from Behavioral Specifications: A Formal Approach", IEEE, 1990, pp. 1131-1134.*

Parekhji et al., "Simulator for IDEAL- Implementation and Environment", IEEE, 1991, pp. 187-194.*

Bayoumi et al., "SPHINX: A High Level Synthesis System for DSP Design", IEEE, 1992, pp. 172-175.*

Pasquier et al., "An Object-Based Executable Model for Simulation of Real-Teim Hw/Sw Systems", Proceedings of 1999 Design, Automation and Test in Europe Conference and Exhibition, 1999, pp. 782-783.*

Blank et al., "Symbolic Simulation Techniques- State-of-the-art and Applications", Proceedings of Sixth IEEE International High-Level Design Validation and Test Workshop, 2001, pp. 45-50.*

Coppola et al., "IPSIM: SystemC 3.0 Enhancements for Communication Refinement", Design, Automation and Test in Europe Conference and Exhibition, 2003, pp. 106-111.*

Schliebusch, et al. Architecture Implementation Using the Machine Description Language Lisa. In Proc. Of the ASPDAC, Jan. 2002, pp. 239-244.

C.W. Fraser, D.R. Hanson, T.A. Proebsting: Engineering a Simple, Efficient Code Generator Generator, ACM Letters on Programming Languages and Systems, vol. 1, No. 3, Sep. 1992, pp. 213-226.

J. Van Praet D. Lanneer, G. Goossens, W. Geurts, H. De Man: A Graph Based Processor Model for Retargetable Code Generation, European Design and Test Conference (ED & TC), 1996, 6 pages.

R. Leupers, P. Marwedel: Retargetable Generation of Code Selectors From HDL Processor Models, European Design & Test Conference (ED & TC), 1997, 5 pages.

A. Nohl and V. Greive et al. Instruction Encoding Synthesis for Architecture Exploration Using Hierarchical Processor Models. In Proc. Of the DAC, Jun. 2003, pp. 262-267.

A. Nohl, G. Braun, et al. A Universal Technique for Fast and Flexible Instruction-Set Architecture Simulation, In Proc. Of the DAC, Jun. 2002, pp. 22-27.

P. Mishra, N. Dutt, and A. Nicolau, Functional Abstraction Driven Design Space Exploration of Heterogeneous Programmable Architectures. In Proc. Of the ISSS, Oct. 2001, pp. 256-261.

M. Itoh, M. Imai et al. Peas-III: An ASIP Design Environment. In Proc. Of the ICCD, Sep. 2000, pp. 430-436.

M. Hartoog, J.A. Rowson et al. Generation of Software Tools From Processor Descriptions for Hardware/Software Codesign. In Proc. Of the DAC, Jun. 1997, pp. 303-306.

A. Hoffmann, T. Kogel et al. A Novel Methodology for the Design of Application-Specific Instruction-Set Processors (ASIP) Using a Machine Description Language. IEEE Transactions on Computer-Aided Design, Nov. 2001, vol. 20, No. 11, pp. 1338-1354.

P. Viana, E. Barros, S. Rigo, R.J. Azevedo, G. Araujo: Exploring Memory Hierarchy with ARCHC, 15th Symposium on Computer Architecture and High Performance Computing (SBAC), 2003, pp. 2-9.

W. Qin, S. Malik, Flexible and Formal Modeling of Microprocessors With Application to Retargetable Simulation, Design, Automation, and Test in Europe (DATE), Mar. 2003, pp. 556-561.

S. Hanono, S. Devadas: Instruction Selection, Resource Allocation, and Scheduling in the AVIV Retargetable Code Generator, 35th Design Automation Conference (DAC), 1998, pp. 510-515.

A.V. Aho, M. Ganapathi, S.W.K. Tjiang: Code Generation Using Tree Matching and Dynamic Programming, ACM Trans. On Programming Languages and Systems 11, No. 4, Oct. 1989, pp. 491-516.

C. Liem, P. Paulin, M. Cornero, A. Jerraya: Industrial Experience Using Rule-Driven Retargetable Code Generator for Multimedia Applications, 8th Int. Symp. On System Synthesis (ISSS), 1995, pp. 60-65.

S. Weber, K. Keutzer et al. Multi-View Operational-Level Design-Supporting the Design of Irregular ASIPS. Technical Report UCG/ERL M03/12, UC Berkeley, Apr. 2003, 7 pages.

L. Nowak: Graph Based Retargetable Microcode Compilation in the Mimola Design System, Association for Computing Machinery (ACM), 1987, pp. 126-132.

Kobayashi, S. et al: Design Space Exploration for DSP Applications Using the ASIP Development System Peas-III, Dept. of Informatics and Mathematical Science, Graduate School of Engineering Science, Osaka University, 2002, pp. 3168-3171.

Gonzalez, R.: XTENSA: A Configurable and Extensible Processor, IEEE Micro, 2000, pp. 60-70.

X. Nie and L. Gazi. A New Network Processor Architecture for High-Speed Communications. In Proc. Of the SIPS, 1999, pp. 548-557.

G. Araujo. Code Generation Algorithms for Digital Signal Processors, Ph.D. thesis, Princeton University, Department of Electrical Engineering, Jun. 1997, 180 pages.

* cited by examiner

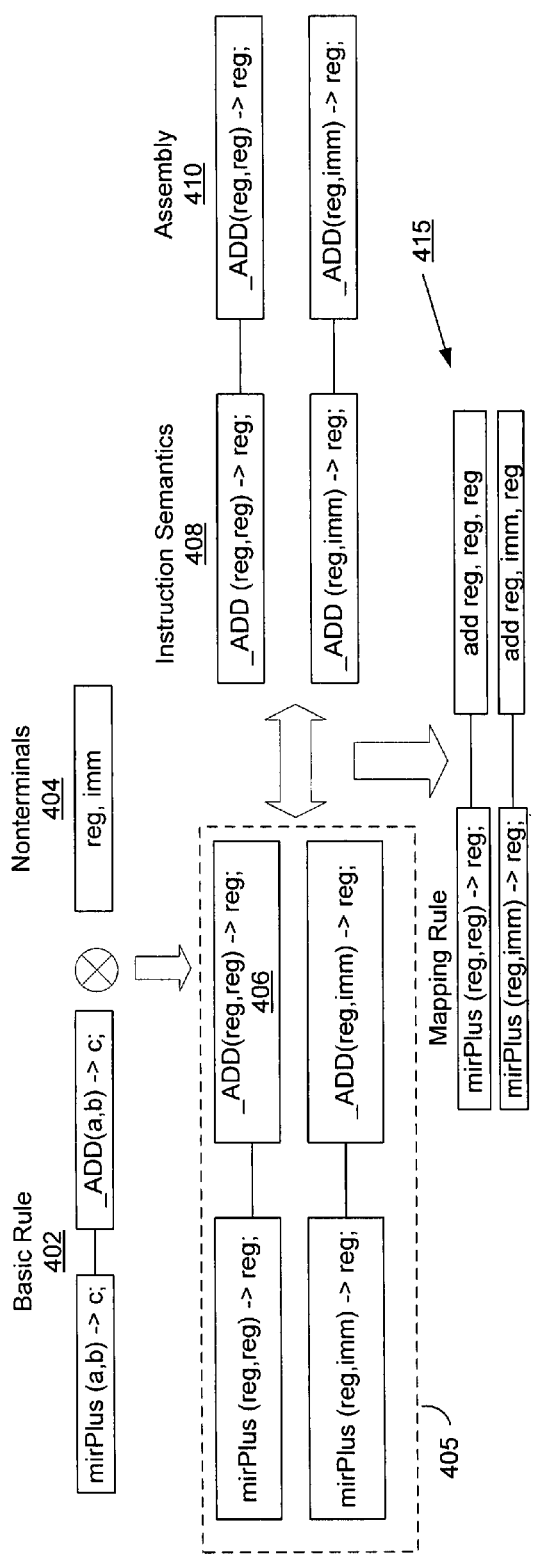
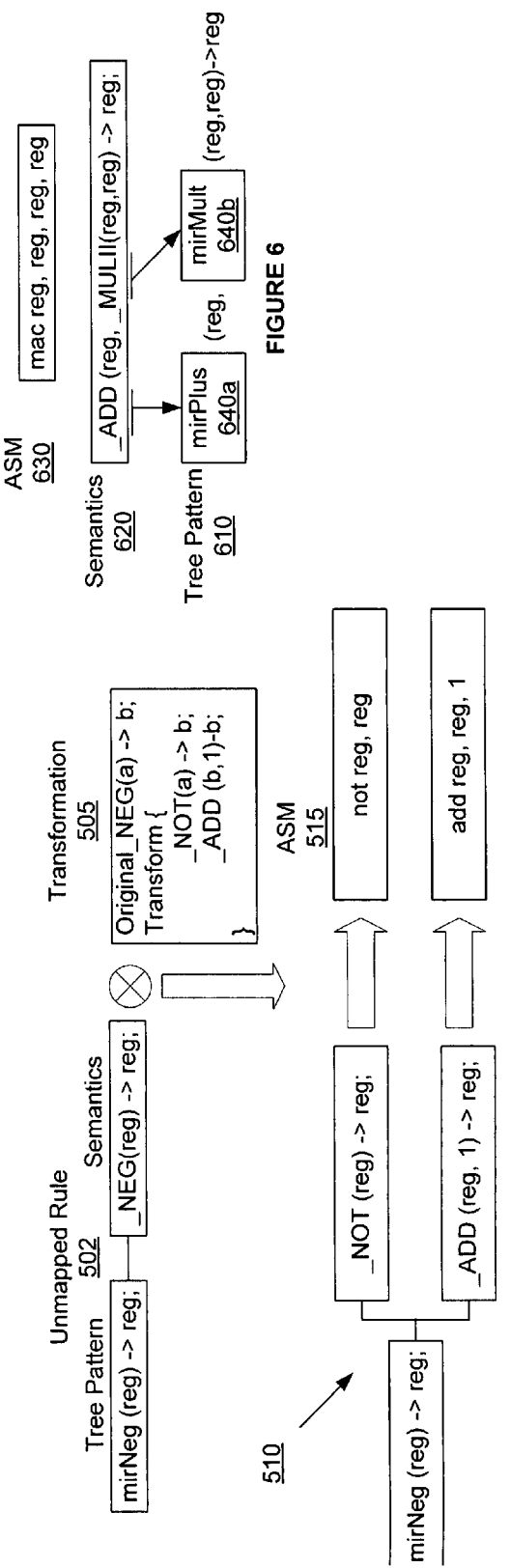

700

```
┌─────────────────────────────────────────────────────────────────────────┐
│ Extract semantic information and assembly syntax from a target          │
│ architecture model                                                       │
│ 710                                                                      │
└─────────────────────────────────────────────────────────────────────────┘
                                    ↓
┌─────────────────────────────────────────────────────────────────────────┐
│ Associate the extracted syntax with the extracted semantic information   │
│ and store in a database                                                  │
│ 720                                                                      │
└─────────────────────────────────────────────────────────────────────────┘
                                    ↓
┌─────────────────────────────────────────────────────────────────────────┐
│ Extract nonterminals from the target architecture model                  │
│ 730                                                                      │
└─────────────────────────────────────────────────────────────────────────┘
                                    ↓
┌─────────────────────────────────────────────────────────────────────────┐
│ Access basic rules that map from source code operations to semantic      │
│ patterns                                                                 │
│ 740                                                                      │
└─────────────────────────────────────────────────────────────────────────┘
                                    ↓
┌─────────────────────────────────────────────────────────────────────────┐
│ Permute the basic rules based on the extracted nonterminals to form set  │
│ of permuted mapping rules                                                │
│ 750                                                                      │
└─────────────────────────────────────────────────────────────────────────┘
                                    ↓
┌─────────────────────────────────────────────────────────────────────────┐
│ Search database for semantics statements that match the semantic         │
│ patterns in the rules                                                    │
│ 760                                                                      │
└─────────────────────────────────────────────────────────────────────────┘
                                    ↓
┌─────────────────────────────────────────────────────────────────────────┐
│ Access a library of pre-defined semantic transformations                 │
│ 770                                                                      │
└─────────────────────────────────────────────────────────────────────────┘
                                    ↓
┌─────────────────────────────────────────────────────────────────────────┐
│ Create semantic transformations of extracted semantic information in     │
│ database to achieve semantic matches for permuted rules that are as yet  │
│ unmapped                                                                 │
│ 775                                                                      │
└─────────────────────────────────────────────────────────────────────────┘
                                    ↓
┌─────────────────────────────────────────────────────────────────────────┐
│ Match semantics of the permuted mapping rules to the semantic            │
│ transformations                                                          │
│ 780                                                                      │
└─────────────────────────────────────────────────────────────────────────┘
                                    ↓
┌─────────────────────────────────────────────────────────────────────────┐
│ Create tree pattern for a new rule by analyzing the semantics of complex │
│ instructions in database (Optional)                                      │
│ 790                                                                      │
└─────────────────────────────────────────────────────────────────────────┘
```

FIGURE 7

METHOD AND DEVICE FOR SIMULATOR GENERATION BASED ON SEMANTIC TO BEHAVIORAL TRANSLATION

RELATED APPLICATIONS

This Application claims priority to U.S. Provisional Application entitled, "C COMPILER RETARGETING BASED ON INSTRUCTION SEMANTICS MODELS," to Braun et al., Application No. 60/574,794, filed on May 26, 2004, which application is hereby incorporated by reference.

This Application is related to U.S. Application entitled, "METHOD AND DEVICE FOR COMPILER RETARGETING BASED ON INSTRUCTION SEMANTIC MODELS," to Braun et al., application Ser. No. 11/140,353, filed concurrently herewith.

This Application is related to U.S. Application entitled, "GENERATION OF COMPILER DESCRIPTION FROM ARCHITECTURE DESCRIPTION," to Braun et al., application Ser. No. 10/815,228, filed on Mar. 30, 2004.

This Application is related to U.S. Application entitled, "METHOD AND SYSTEM OF SCHEDULING INSTRUCTIONS," to Braun et al., application Ser. No. 11/096,184 filed on Mar. 30, 2005.

FIELD OF THE INVENTION

Embodiments of the present invention relate to the field of software tools for system level design. Specifically, embodiments of the present invention relate to automatically generating a simulator for a target architecture based on a semantic model of the target architecture.

BACKGROUND ART

The design and test of modern electronic devices, such as embedded processors (EP) and systems-on-a-chip (SoC), is a complex process involving many stages. For example, many systems, such as mobile devices, networking products, and modems require new embedded processors (EP). These EPs can either be general purpose, such as microcontrollers and digital signal processors (DSP), or application specific, using application specific instruction set processors (ASIP). Compared to general-purpose processors, ASIPs provide a tradeoff of computational performance and flexibility on the one hand and power consumption on the other. Therefore, ASIPs that are designed to execute specific tasks very efficiently can be found in a wide range of embedded systems.

However, designing systems with ASIPs is far more complex than assembling systems with standard processors. Typically, designing ASIPs comprises an iterative exploration in which hardware and software are explored and modified. This iterative process is referred to as an architecture exploration loop. The architecture exploration typically requires a software toolkit including: an assembler, linker, compiler, and simulator. If hardware and software are available, profiling results are acquired that usually lead to architecture modifications making the processor more efficient. To be consistent with these modifications, the software tools potentially need to be changed, as well.

Architecture description languages (ADL) have been established to aid the design of application-specific instruction-set processors (ASIP). Their main contribution is the automatic generation of the aforementioned software toolkit. Hence, the challenge in the design of such ADLs is to unambiguously capture the architectural information required for the toolkit generation in a single model.

One of the most challenging tasks in the design of ADLs is to capture the architectural information required for the software tool generation in a consistent and unambiguous way. In particular, the compiler and the instruction-set simulator (possibly on different abstraction levels) require the specification of the instructions' semantics; however, from very different points of view. While a compiler generally only needs information about what an instruction does, the simulator needs the details of how the instruction performs its particular task. It is a difficult task, if not impossible, to derive the semantics from the behavior (or vice versa). Therefore, no known conventional ADL solves this problem satisfactory. Examining the variety of ADLs, one can distinguish two major approaches: either redundancy is introduced by providing the semantical information separate from the behavioral information (e.g., a separate compiler and simulator specification), or the set of architectures that can be modeled is reduced by introducing a more formalized but inflexible description of the instruction behavior.

Most of the known conventional ADLs have originally been designed to aid the automation of a particular piece in the puzzle, and have then been extended to address larger parts of the embedded processor design. For example, some ADLs are well-suited for the automatic generation of a C compiler, although they impose major restrictions on, or are even incapable of, the generation of a cycle-accurate simulator.

After examination of today's state of the art, the existing ADLs can be separated into three categories: those which are capable of generating either a compiler or a cycle accurate simulator for contemporary processors, those which introduce redundancy by separating the semantic and the behavioral description, and those that combine semantics and behavior into a very restrictive grammar, hence sacrificing flexibility.

The first category includes languages such as ISDL (Instruction Set Description Language) or LISA 1.0, a former version of LISA (Language for Instruction Set Architectures). ISDL has been reported to generate efficient compilers, however, it is not capable of describing processors on cycle-accurate level. Hence, cycle accurate simulators cannot be generated.

The EXPRESSION ADL belongs to the second group, as a C compiler (EXPRESS) as well as a simulator (SIMPRESS) may be automatically generated. However, the views for both are separated into two different sections of the architecture description. While the simulator employs the information in a behavior section, the compiler relies on the existence of a so-called operation mapping, which associates the instruction with a tree of primitive operations similar to the nodes in a compiler's intermediate representation (IR). Naturally, this aids the task of code selection, but at the expense of the incorporation of redundant, purely compiler-specific information into the ADL.

By far the most approaches can be found in the third category. ADLs such as nML, MIMOLA, and PEAS-III define a very restricted grammar for the modeling of the instruction behavior, mostly by offering a set of predefined operators that can be combined into a behavioral description. For each operator, the functional behavior (for simulation) as well as its semantics (for compilation) are defined and usually contained in additional libraries. A further step is taken by a number of approaches employing so-called parameterizable generic processor cores, such as Xtensa architecture. Such cores usually have a fixed instruction-set, which can be extended by adding predefined or user-defined instructions. As software toolkit and synthesizable RTL model are available for the fixed part of the core, only the additional instructions must be taken into account. However, most of the user-defined instructions cannot be utilized by the compiler's code selector. The approaches in this category are rather suitable for the design of domain-specific processors than for ASIPs as they allow little flexibility for modeling complex pipelines and execution schemes.

SUMMARY OF THE INVENTION

Therefore, it would be advantageous to eliminate or at least substantially reduce redundancy in a target architecture model that may be used in automatic generation of software tools. It would be further advantageous to allow a wide variety of architectures to be described by a target architecture model that may be used in automatic generation of software tools. It would be still further advantageous to be able to automatically generate a wide variety of software tools from a single target architecture model. It would be still further advantageous to be able to automatically generate simulators at multiple abstraction levels from a single target architecture model. It would be still further advantageous to meet the above constraints while being compatible with existing technologies for developing embedded processors, systems-on-a-chip, and ASIPs.

Accordingly, embodiments of the present invention provide methods and devices that eliminate or at least substantially reduce redundancy in a target architecture model that may be used in automatic generation of software tools. Embodiments of the present invention allow a wide variety of architectures to be described by a target architecture model that may be used in automatic generation of software tools. Embodiments of the present invention automatically generate a wide variety of software tools from a single target architecture model. Embodiments of the present invention automatically generate simulators at multiple abstraction levels from a single target architecture model. Embodiments of the present invention meet the above constraints while being compatible with existing technologies for developing embedded processors, systems-on-a-chip, and ASIPs. Embodiments of the present invention provide these advantages and others not specifically mentioned above but described in the sections to follow.

One embodiment of the present invention comprises a computer-implemented method of generating a simulator from an architecture description. The method comprises accessing a target architecture model described in an architecture description language (ADL). The model comprises a semantic representation of an instruction set for the target architecture. The semantic representation is translated to a behavioral representation. The simulator is automatically generated from the behavioral representation.

Another embodiment of the present invention comprises automatically generating an instruction accurate simulator from the semantic representation in accordance with the above process and automatically generating a cycle accurate simulation from a behavioral section describing the instruction set at a different abstraction level from the semantic representation and co-existing with the semantic representation in the model.

Another embodiment of the present invention comprises automatically generating a compiler description from the semantic representation in addition to generating a simulator from the semantic representation.

Another embodiment of the present invention is a computer-implemented method of automatically generating simulators at different abstraction levels. The method comprises accessing a bi-abstract target model comprising a semantic description of an instruction set and a behavioral description of the instruction set. The semantic and behavioral description describe the same target architecture model at different abstraction levels and co-exist in said model. An instruction accurate simulator is automatically generated from the semantic description. A cycle accurate simulator is automatically generated from the behavioral description.

BRIEF DESCRIPTION OF THE DRAWINGS

FIG. 4 reviews a one-to-one mapping procedure of a basic rule, in accordance with an embodiment of the present invention.

FIG. 5 illustrates an example of a semantic transformation, in accordance with an embodiment of the present invention.

FIG. 6 illustrates an example of many-to-one mapping, in accordance with an embodiment of the present invention.

FIG. 7 is a flowchart illustrating a computer process of generating compiler code selector rules from a target architecture description, in accordance with an embodiment of the present invention.

DETAILED DESCRIPTION OF THE INVENTION

In the following detailed description of embodiments of the present invention, automatically generating a simulator by translating instruction semantics to a behavioral section, numerous specific details are set forth in order to provide a thorough understanding of the present invention. However, it will be recognized by one skilled in the art that the present invention may be practiced without these specific details or with equivalents thereof. In other instances, well-known methods, procedures, and components have not been described in detail as not to unnecessarily obscure aspects of the present invention.

Notation and Nomenclature

Some portions of the detailed descriptions that follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "executing" or "converting" or "generating" or "processing" or "computing" or "translating" or "mapping" or "determining" or "maintaining" or "creating" or "storing" or "transforming" or "accessing" or "extracting" or "selecting" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Figure 1:
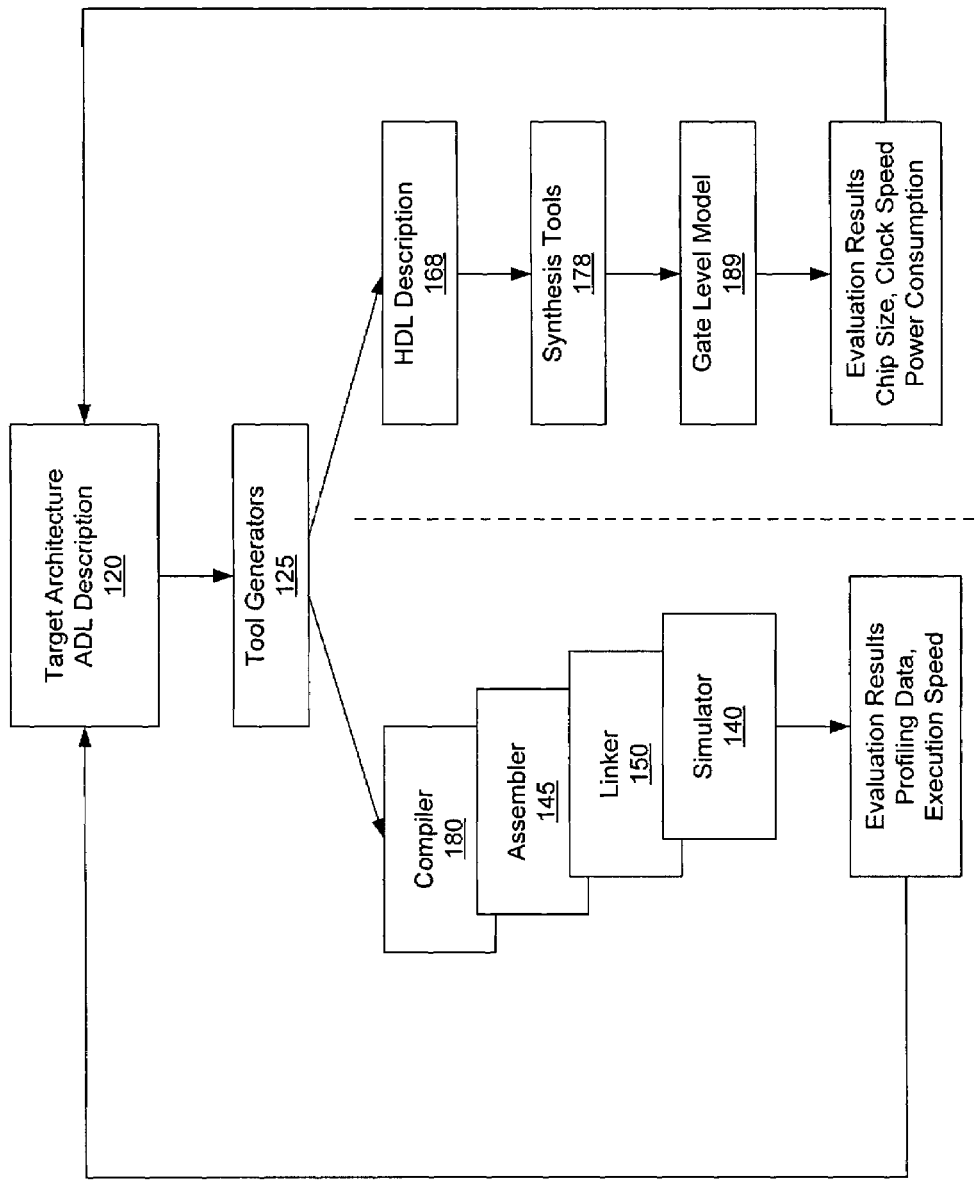
FIG. 1 illustrates an overview of a design flow, involving automatic generation of a retargetable compiler from a description of a target architecture, in accordance with an embodiment of the present invention.

FIG. 1 illustrates an overview of a design flow, which involves automatic generation of a retargetable compiler from a description of a target architecture in accordance with an embodiment of the present invention. The design flow starts with an architecture description language (ADL) description of a target architecture 120, which may be supplied by a user. In accordance with an embodiment of the present invention, the target architecture ADL description 120 is input to one of the automatic tool generators 125, which outputs a compiler 180 adapted for the target architecture.

An instruction set simulator 140 may be automatically generated from the target architecture ADL description 120, in accordance with an embodiment of the present invention. In accordance with an embodiment of the present invention, the target architecture ADL description 120 is input to one of the automatic tool generators 125, which outputs a simulator 140 adapted for the target architecture.

Other tools may be used in the exploration path, such as an assembler 145 and a linker 150. These tools may also be automatically generated from the target architecture description 120, although such automatic generation is not required for the present invention. It is also possible to generate tools and descriptions along the implementation path, such as an HDL description 168, synthesis tools 178, and a gate level model 189. However, generation of these tools and descriptions is not a requirement of the present invention.

Along both the exploration path and the implementation path, the user may evaluate results and modify the target architecture ADL description 120 based thereon. With this approach, the target architecture design is simplified due to a high degree of automation and the fact that the user may specify a single target architecture description 120 for the entire design flow. In a typical design flow, the initial target architecture description may be at a high level of abstraction, wherein the user adds complexity to the target architecture description based on the evaluation results.

Retargetable Compiler Generation

Figure 2:
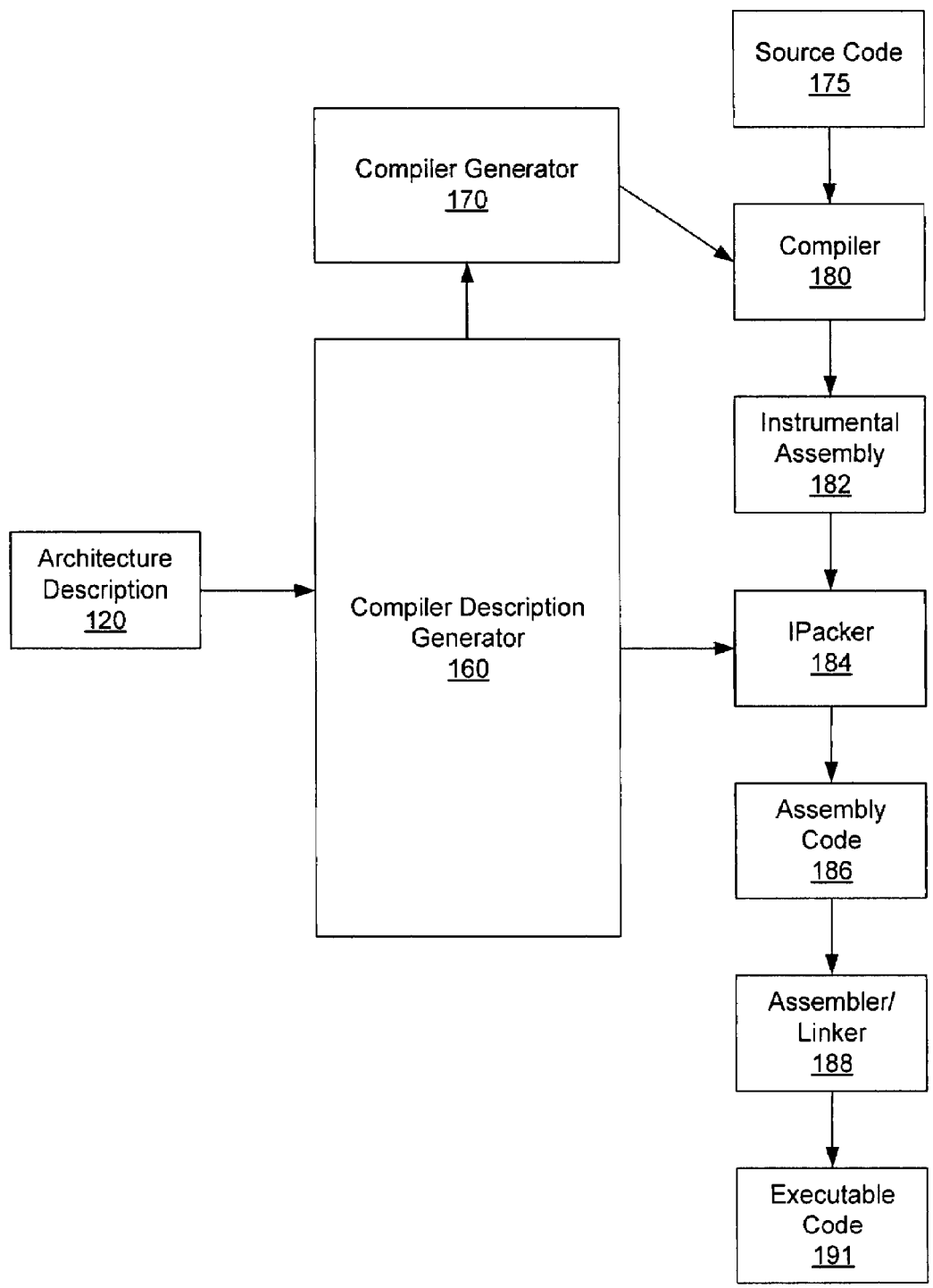
FIG. 2 illustrates a diagram of automatic generation of a retargetable compiler from a description of a target architecture, in accordance with an embodiment of the present invention.

Referring now to FIG. 2, during compiler generation in accordance with embodiments of the present invention, the target architecture description 120 is analyzed and compiler-relevant information is automatically extracted based on semantic information. For example, a semantic description of instructions. From the semantic information, the compiler description generator 160 generates a compiler generator description (CGD), which is input into the compiler generator 170, which outputs the compiler 180. A suitable compiler generator 170 in one embodiment is the COSY® Compiler Development System provided by Associated Computer Experts (ACE) of Amsterdam, The Netherlands. However, the present invention is not limited to using the COSY® Compiler Development System to generate the compiler 180.

The compiler 180 parses the source code 175, applies typical high-level optimizations, utilizes a tree pattern matcher for code selection and conducts a global register allocation. Embodiments of the present invention automatically generate a description of code selector rules that may be used for the tree pattern matcher. The output of the compiler 180 is unscheduled instrumented assembly code 182 that is compliant with the target architecture. Each assembly instruction in the unscheduled instrumented assembly code 182 contains an instruction class identifier and information about the resources (e.g., registers, memory) that it reads or writes. From this input, the Ipacker tool 184 creates a dependence directed acyclic graph (DAG). The DAG is fed into a mixedBT scheduler, which is implemented in the Ipacker tool 184. The scheduling result is assembly code 186 that is compliant with the ADL model of the target architecture. The assembly code 186 is read by the assemblerainker 188. The assemblerainker may be generated from the target architecture description 120 as well. However, the generation of the assembler/linker is not a requirement of the present invention. Finally, executable code 191 is output.

Embodiments of the present invention adapt the compiler backend (or code generator) to the target architecture. A compiler backend typically has a code selector, a register allocator, and an instruction scheduler as its main building blocks. Embodiments of the present invention automatically generate code selector rules for the target architecture based on explicit semantic information in the target architecture ADL.

Techniques for automatically generating register allocator and instruction scheduler portions of the compiler backend from a target architecture ADL are described in co-pending U.S. patent application Ser. No. 10/815,228, entitled "GENERATION OF COMPILER DESCRIPTION FROM ARCHITECTURE DESCRIPTION," filed on Mar. 30, 2004, and assigned to the assignee of the present invention and incorporated herein by reference, and in co-pending U.S. patent application Ser. No. 11/096,184, entitled "METHOD AND SYSTEM OF SCHEDULING INSTRUCTIONS," filed on Mar. 30, 2005, and assigned to the assignee of the present invention and incorporated herein by reference. Techniques described in these referenced patent applications employ a semi-automatic Graphical User Interface (GUI) based approach that allow a user to specify the code selector's mapping rules. Furthermore, certain compiler relevant information is automatically extracted from the target architecture ADL.

Embodiments of the present invention do not require a GUI for supplying information for generating compiler code selector rules. Embodiments of the present invention eliminate the semantic gap between the ADL, which captures many details of instruction execution in hardware, and the compiler view of a target architecture, which may require more abstract instruction semantics information. Embodiments of the present invention eliminate this semantic gap by a novel three-phase technique for code selector rule generation based on explicit semantic information in the target architecture ADL model. This includes extracting the mapping rules for the compiler's code selector based on explicit instruction semantics information in the target ADL model.

Embodiments of the present invention use a semantics view of operations that captures behavior at a relatively high abstraction level. In a typical ADL having a behavioral view of operations, state updates of processor resources are described in plain code (e.g., C/C++ code) to achieve flexibility and simulation speed. However, since the same behavior may be described with numerous syntactic variances in, e.g., C/C++, it is generally not possible to automatically extract the operation semantics, (e.g., a more abstract compiler-oriented view) from such a specification. For code generation, the compiler needs information about the semantics of an operation (e.g. whether an operation performs an ADD or SUB on visible data registers), as well as a few side effects like implicit modification of the carry or zero flag.

On the other hand, the compiler does not need information about execution details in hardware, such as access to instruction pipeline registers. Therefore, some of the detailed information in the target architecture ADL is not needed for compiler generation. Embodiments of the present invention, therefore, capture instruction semantics explicitly in the target architecture model by using a limited and precisely defined set of micro-operators in SEMANTICS statements, which describe the instruction set. Micro-operators are atomic elements from which larger elements such as assembly instructions can be constructed. Micro-operators typically describe a computation on processor resources that can be executed by a data path component such as an ALU (e.g. a 16-bit ADD). While micro-operators are a convenient way to capture instruction semantics, the present invention is not limited to using micro-operators as described herein to achieve a semantic description of the target architecture instruction set.

Figure 3:
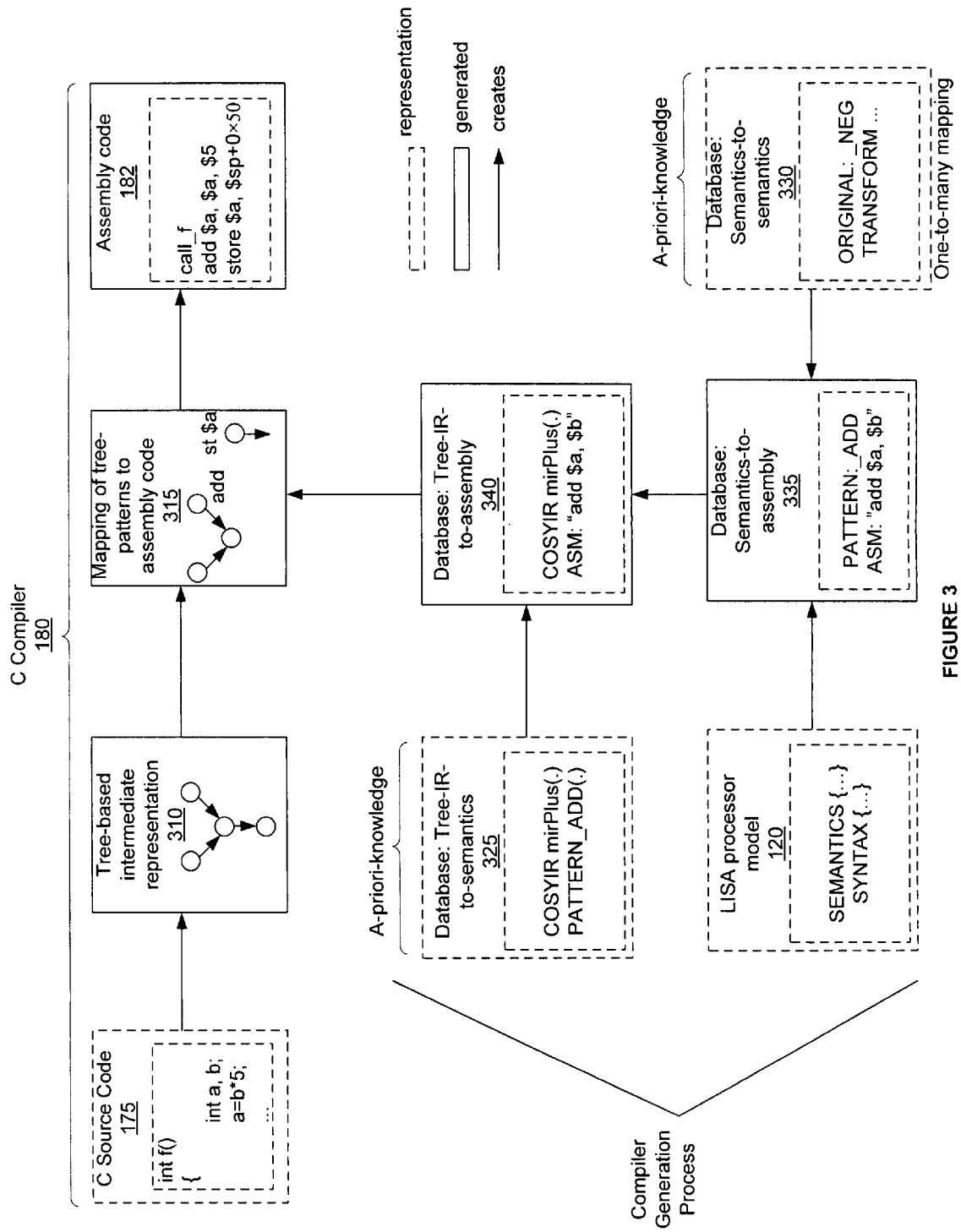
FIG. 3 illustrates an overview of code selector rule generation, in accordance with an embodiment of the present invention.

FIG. 3 illustrates an overview of code selector rule generation and use thereof in a compiler, in accordance with an embodiment of the present invention. The mapping of tree-patterns to assembly code 315 used by the compiler 180 may be derived from the description of the code selector rules generated by embodiments of the present invention. The compiler 180 generates a tree-based intermediate representation 310 from the input source code 175 per known techniques. The compiler 180 uses the code selector rules 315 to produce assembly code 182 from the intermediate representation 310.

The automatic generation of the code selector rules involves extracting information from the target architecture ADL model 120, which may comprise a semantic section and a syntax section. The semantic section describes what an instruction does. The syntax section describes the actual assembly code for a machine instruction. From the semantic section and the syntax section, a semantics-to-assembly database 335 is created by an embodiment of the present invention.

FIG. 3 also depicts two databases comprising a priori knowledge. A basic rules database 325 comprises basic rules that map from a tree intermediate representation to semantics. In other words, this basic rule database 325 has basic rules each of which maps from a source code operation to a semantic statement that describes a machine instruction that is capable of performing the source code operation. An exemplary basic rule is depicted in Table IX herein.

A tree-IR-to-assembly database 340 is automatically generated from the basic rule database 325 and the semantics-to-assembly database 335 by an embodiment of the present invention. Content from the tree-IR-to-assembly database 340 may be used in a compiler generator description (CGD), which may be input into a compiler generator, such as compiler generator 170 of FIG. 2. The compiler generator description will typically include other information to generate aspects of the compiler other than the code selector rules.

Another database is a semantic transformation database 330. This database 330 may comprise pre-defined semantic transformations that map from a single semantic statement to a plurality of semantic statements. This semantic transform information is typically used to look for combinations of semantic statements in the semantics-to-assembly database 335 that equate to single semantic statements in the basic rules database 325, as will be discussed more fully herein.

An exemplary ADL that may be used to describe target architectures is the LISA language. A LISA processor description typically comprises a resource specification and an operation tree. The resource portion may describe memories, caches, processor registers, signals, and pipelines. The operation tree may be a hierarchical specification of instruction coding, syntax, and behavior. For example, the operation may provide for different views on primitive operations of the target machine such as assembly syntax, pipeline timing, binary encoding, and behavior, e.g., state transitions of the processor resources.

Depending on the abstraction level of the model (e.g., instruction accurate or cycle accurate), an operation may describe an entire instruction, a part of an instruction (e.g., an immediate operand), or even a piece of a functional unit (e.g., a stage of a pipelined multiplier). Each operation may contain a number of sections describing the attributes of the operation dependent on its purpose. As an example, an operation modeling (a part of) an instruction usually contains a SYNTAX section specifying the instruction's assembly syntax. An exemplary operation with a behavioral section is shown in Table I.

TABLE I

```
OPERATION ADD {
DECLARE {
GROUP src1, dst = { reg };
GROUP src2 = { reg || imm };}
SYNTAX { "add" dst "," src1 "," src2 }
CODING { 0b0000 src1 src2 dst }
BEHAVIOR {
dst = src1 + src2;
if ( ((src1 < 0) && (src2 < 0))
```

TABLE I-continued

```
II ((src1 > 0) && (src2 > 0) && (dst < 0))
II ((src1 > 0) && (src2 < 0) && (src1 > -src2))
II ((src1 < 0) && (src2 > 0) && (-src1 < src2)))
)
{ carry = 1; }}}
```

The conventional operation In Table I (describing a simple add instruction) illustrates that even for this relatively simple operation, it is nearly impossible to extract the operation's semantics from the behavioral description. In particular, when considering the flexibility of languages such as "C," the presented description is only one technique to model an add with carry flag computation. From the example, one can derive the requirements for a semantic operation description: uniqueness, simplicity, and flexibility. For most operations, there should be only a single, concise way to define the semantics, while the grammar of a SEMANTICS section should be flexible enough to describe complex operations. Embodiments of the present invention provide for a semantic extension to an ADL such as LISA. However, the present invention is not limited to LISA.

A simplified ADL operation example having a SEMANTIC statement or section is given in Table II. The target architecture may be described by a number of such operations. The SEMANTIC statement describes what the operation does and may be used in the automatic generation of the code selector of a compiler, in accordance with embodiments of the present invention. Table II shows the ADD operation from Table I using a SEMANTICS statement, in accordance with an embodiment of the present invention, instead of a BEHAVIOR section. An operation may include both a SEMANTICS section and a BEHAVIOR section, but that is not required. A single SEMANTICS statement consisting of a single micro-operator may be used to precisely describe the purpose of the operation.

TABLE II

```
OPERATION ADD {
  DECLARE {
    GROUP src1, dst = { reg };
    GROUP src2 = { reg II imm };}
    SYNTAX { "add" dst "," src1 "," src2 }
    CODING { 0b0000 src1 src2 dst }
    SEMANTICS { _ADDI[_C] ( src1, src2 ) -> dst; }}
```

In most cases, the semantics of an instruction can be described by taking one or more of the instruction's parameters (and possibly other resources such as a stack pointer, general purpose register, memory), performing a computation on those operands, and finally modifying one or more of the instruction's operands (and/or processor resources). Thus, a user can easily construct a semantic description from information such as the above. Such description can be very elegant because information such as pipeline registers, threads, and internal signals typically can be omitted.

As previously discussed, a micro-operator is an atomic element from which larger elements such as assembly instructions can be constructed. Micro-operators are primitive operators that may be similar to instructions of a RISC ISA (reduced instruction set computing instruction set architecture), which allow modeling simple instructions by means a single micro-operator, and complex instructions (as found in CISC (Complex Instruction Set Computer) machines) by a combination of micro-operators.

In the example of Table II, the micro-operator ADDI in the SEMANTICS statement defines the integer addition. Certain micro-operators can read or write flags as a side effect. This is denoted by the C in square brackets specifying that the operator affects the carry flag. A comma-separated list of operands follows in parenthesis, and finally, the pointer (→) specifies the location for the result.

Table III provides a list of exemplary micro-operators that may be used in a semantic statement. The present invention is not limited to this list. Moreover, the present invention is not limited to building SEMANTIC statements with micro-operators. For example, elements other than micro-operators may be used to semantically describe the target architecture instruction set.

TABLE III

| | |
|---|---|
| ADD | Description Adds two operands |
| ADDC | Description Adds two operands with carry |
| SUB | Description Subtracts the operand2 from operand1 |
| SUBC | Description Subtracts the operand2 from operand1 with carry |
| MULUU | Description Multiplies the unsigned integer operand1 by unsigned integer operand2 |
| MULIU | Description Multiplies the signed integer operand1 by unsigned integer operand2 |
| MULII | Description Multiplies the signed integer operand1 by signed integer operand2 |
| NEG | Description Produces the negative value of the operand (twos-complement) |
| AND | Description Performs a bitwise AND operation on operand1 and operand2 |
| OR | Description Performs a bitwise OR operation on operand1 and operand2 |
| XOR | Description Performs a bitwise XOR operation on operand1 and operand2 |
| NOT | Description Performs a bitwise NOT operation on operand |
| LSL | Description Performs a logical left shift operation on operand1 by operand2 bits. |
| LSR | Description Performs a logical right shift on operand1 by operand2 bits |
| ASR | Description Performs an arithmetic right shift on operand1 by operand2 bits |
| ROTL | Description Rotational left shift on operand1 by operand2 bits |
| ROTR | Description Rotational right shift on operand1 by operand2 bits |
| SXT | Description Performs a sign extension to the operand |
| ZXT | Description Performs a zero extension to the operand |
| INDIR | Description References a specific memory location pointed by operand |
| NOP | Description Do nothing |
| INTRINSIC OP | Description User-defined architecture-specific operations |

The operands of the micro-operator can be either terminal elements, such as integer constants, or other operations. In the latter case, the respective operations should contain a SEMANTICS section on their own. In the example in Table IV, the SEMANTICS section of the reg operation defines the semantic type of the operand—here, a 32-bit integer register specified as array R in a RESOURCE section (not shown).

TABLE IV

```
OPERATION reg {
  DECLARE {
    LABEL index;
    SYNTAX { "R" index=#U4 }
    CODING { index=0bxxxx }
    SEMANTICS { _REGI(R[index])<0..31>}}
```

In general, each operand of a micro-operator can be represented as a 3-tuple (u; v; w) comprising the value/ resource (u) and a bit-field specification represented by bit offset (v) and bit width (w). The corresponding 3-tuple for operation reg in Table IV is (u; v; w)=(R[index]; 0; 32).

The same formalism can be applied to the operation ADD depicted in Table II. As no explicit bit-field specification is given in the SEMANTICS section of the ADD operation, the expression shares the specification of the operands. In other words, the addition of two operands (a; 0; 32) and (b; 0; 32) results in the 3-tuple (c; 0; 32), where c is the result of the 32-bit addition of a and b.

The generic 3-tuple operand representation allows for a very compact instruction-set description while keeping the number of required micro-operators small. But there is another advantage: micro-operators can be used as operands for other micro-operators, which is referred to herein as chaining micro-operators.

Note that micro-operators generally do not describe entire source code level (e.g., C-level) operations and machine instructions. As described herein, embodiments of the present invention allow source code operations to be composed of multiple micro-operators (e.g. a 32-bit ADD can be described as a sequence of a 16-bit ADD and another 16-bit ADD with carry). In a similar fashion, embodiments of the present invention enable complex instructions (such as Multiply Accumulate or MAC) by chaining multiple micro-operators.

In order to model complex instructions, two mechanisms may be employed that combine two or more micro-operators, namely, chaining and parallelizing. Both are illustrated in Table V. The example shows the description of a dual multiply-accumulate instruction (DMAC), which carries out a 32×32 multiplication and accumulates the high and low word of the 64-bit result in two separate registers. Each line of the SEMANTICS section in Table V describes one of the MAC operations.

TABLE V

```
OPERATION DMAC {
  DECLARE {
  GROUP src1, src2, dst1, dst2 = { reg };
  SYNTAX { "dmac" dst2 ":" dst1 "," src1 "," src2 }
  SEMANTICS {
  _ADDI ( _MULUU( src1, src2 )<0..31>, dst1 ) -> dst1;
  _ADDI ( _MULUU( src1, src2 )<32..63>, dst2 ) -> dst2;}}
```

The two MACs are executed in parallel, which is reflected in the semantic description by the following exemplary Rule 1, where a statement is defined as a (chain of) micro-operators concluded by a semicolon.

Rule 1: All statements in a single SEMANTICS section are evaluated in parallel.

The individual MAC operations are expressed as additions taking the result of a multiplication as first operand, thus building a micro-operator chain. Chained expression are evaluated in a sequence, as defined by the following exemplary Rule 2:

Rule 2: In a chained micro-operator, the innermost micro-operator (operand) is evaluated before its embracing micro-operator (operator).

The bit-field specification in angle brackets is used to meet the constraint of matching bit widths of the operands of ADDI. The micro-operator approach has at least two major advantages. First, only a small set of micro-operators is sufficient to describe nearly all instructions of a typical architectures by means of SEMANTICS sections without changing the operation structure of the (already existing) models. Second, the chaining mechanism avoids the usage of temporary variables, which guarantees a tree structure for each semantic statement. Such trees are extremely well-suited for compiler generation, as code selectors of compilers (e.g., C compilers) are typically based on tree grammars.

Code Selector Rule Generation

To generate code selectors, embodiments of the present invention employ a tree grammar description of the target instruction set. A tree grammar G=(N; T; P; S) comprises finite sets N and T of nonterminal and terminal symbols, respectively, as well as a set P of (mapping) rules and a start symbol S∈N. The terminals T essentially describe the operations of the source language (e.g., C) and thus are target architecture independent. Likewise, the start symbol S requires no special retargeting effort. Typically, only the nonterminals N and the rules P need to be adapted to the target architecture. The nonterminals N basically reflect available, registers, memories, and addressing modes, while rules P defines how source language operations (or combinations of the same) are implemented by target instructions. Each mapping rule in P has the form of a tree pattern that may serve to cover a partial data flow graph during code selection.

Embodiments of the present invention automatically generate the non-terminals (e.g., N) and the mapping rules (e.g., P) from semantic information in a target architecture processor model. Syntax information in the target architecture model may also be used to generate mapping rules. After nonterminal generation, three cases of mapping between source code operations and micro-operators extracted from the semantic portion of the target architecture model are distinguished. Those mapping include one-to-one, one-to-many, and many-to-one.

One-to-one mapping reflects that a single source code operation may be covered by a single micro-operator, which in this case represents one machine instruction.

One-to-many mapping reflects that implementation of a source code operation requires a sequence of multiple micro-operators (or machine instructions). In this case, an embodiment of the present invention provides an extensible library of rewrite rules to establish the required mapping. The semantic transformation database 330 of FIG. 3 is one example of a database comprising rewrite or semantic transformation rules.

In many-to-one mapping complex mapping rules composed of chained micro-operators are generated if the semantic portion of the target architecture comprises chained micro-operators. Such rules go beyond covering the standard set of source code operations and help to optimize code quality. The semantic description of the target architecture is not required to have such chained micro-operators.

Nonterminal Generation

In tree grammar descriptions, nonterminals are temporary variables connecting different grammar rules. For code selectors, they represent locations like registers and memories in processors, which can be used to store intermediate results. According to their semantic meaning, nonterminals can be put into four categories:

Register nonterminals, which represent compiler usable registers.

Immediate nonterminals, which carry constants that can be put into instruction codings.

Addressing mode nonterminals, which imply the address computation.

Condition nonterminals, which are virtual locations used to store comparison results.

The generation of register and immediate nonterminals may be directly related with two micro-operators, _REGI and _IMMI. Table VI and Table VII shows two exemplary operations, which use the _REGI and _IMMI micro-operators respectively.

TABLE VI

OPERATION reg32{
DECLARE{ LABEL index; }
CODING {value=0bx[4] }
SEMANTICS { _REGI(GPR[index])<0,32>; }

TABLE VII

OPERATION imm8{
DECLARE{ LABEL value; }
CODING { value=0bx[8] }
SEMANTICS { IMMI(value); }
}

In the semantics section of operation reg32 in Table VI, the use of _REGI micro-operator indicates that the operation corresponds to the read/write access of a register file. The expression GPR[index] denotes the register file resource and related coding element. For example, there may be a resource description in the target ADL description for this register file resource. The bit-width of the registers is given out with <0,32> at the end of the statement, which means offset is 0 and width equals 32. Provided this information, the generator will create a corresponding 32-bit register nonterminal.

The generation of immediate nonterminals follows a similar way. Referring now to Table VII, in the semantics section of the imm8 operation, the expression value after the micro-operator _IMMI is the coding element, which is used to hold the constant value. Since the bit-width of value can be resolved from the CODING section, explicit bit specification is not necessary for micro-operator _IMMI.

Since addressing mode nonterminals carry operand(s) for address computation, which varies from architecture to architecture, it may be difficult to describe their semantics with single micro-operator. Therefore, an embodiment of the present invention uses a memory access micro-operator _INDIR. It takes a micro-operator expression as operand, which describes the calculation of addresses. Bit specification must exist to define the size of accessed memory unit. Table VIII shows an exemplary operation LOAD, which loads 32 bit data into a register.

TABLE VIII

OPERATION LOAD{
DECLARE{
GROUP imm = { imm8 };
GROUP rs, rd = {reg32 }; \
}
  SEMANTICS { _INDIR(_ADD(rs, _SXT(imm)<0,32>))<0,32>->rd;
}
...}

In the example in Table VIII, the SEMANTICS statement comprises an _ADD micro-operator representing addition and an _SXT representing the sign extension operation. The sign extension micro-operator is used to achieve an equal bit-width operands condition of the _ADD micro-operator, in this example. Suppose the semantics of imm8 and reg32 is defined as in Table VI and Table VII, the LOAD operation in Table VIII implies a register offset(immediate) addressing mode. A corresponding nonterminal will be created from this exemplary LOAD operation.

Condition nonterminals may be used in compilers to properly write results into flag registers. They may be generated by first checking all semantics sections in the target architecture ADL model. If any one of the four predefined flag registers(carry, zero, negative and overflow) is used in the model, a condition nonterminal will be created.

One-to-One Mapping

In general, a mapping rule comprises three parts: a tree pattern, the result of the rule, and one or several associated machine instructions. The tree pattern represents a source code (e.g., C level) computation that can be performed by the machine instruction(s). The result of a mapping rule is normally a nonterminal. However, a mapping rule is not required to produce a result. The machine instructions and nonterminals are architecture specific elements, which are unknown before the target architecture ADL model is developed. To create mapping rules for target architectures, the generator uses basic rules as rule templates. Referring to FIG. 3, the basic rules database 325 comprises these basic rules.

Table IX provides a basic rule example, which corresponds to the addition operation.

TABLE IX

COSYIR mirPlus(a, b)->c;
PATTERN{ _ADD(a,b)->c; }

In the first line of Table IX, the expression mirPlus(a,b) is a tree pattern, wherein mirPlus is the intermediate representation(IR) tree node used in CoSy, which denotes an addition operation. CoSy is used with the COSY® Compiler Development System provided by Associated Computer Experts (ACE) of Amsterdam, The Netherlands. However, the present invention is not limited to CoSy.

In basic mapping rules, nonterminal place-holders are used. For example, "a" and "b" in the example in Table IX serve as non-terminal placeholders. At the end of the COSYIR statement, "c" is the result of the rule, which is also a nonterminal placeholder. Given this basic rule, the rule generator of an embodiment of the present invention will attempt to replace the placeholders with all possible combinations of available nonterminals generated from the target architecture ADL model to form a mapping rule suitable for the target processor.

Inside the parenthesis after the PATTERN keyword in Table IX is a semantics statement. It describes the semantics of the instruction that can perform the required computation. Basic rules may be architecture independent so that the rule generator can reuse them for different processor designs.

In one-to-one mapping, the generator tries to find an instruction (in the target architecture) that has the same semantics as a generated mapping rule has. FIG. 4 reviews the overall one-to-one mapping procedure of a basic rule, in accordance with an embodiment of the present invention. The basic rule 402 in this case is the one from Table IX. Non-terminals 404 "reg" and "imm" have been extracted from the semantic description of the target architecture.

Still referring to FIG. 4, the placeholders in the basic rule are replaced with various permutations of the nonterminals extracted from the target architecture model, as depicted in the permutated basic rules 405. Not all permutations are depicted in FIG. 4. Each permuted rule has a semantic statement 406. The compiler description generator then attempts to match the semantics statements 406 in the permutated rules with instruction semantics 408 extracted from the target architecture ADL model. Instruction semantics 408 and associated assembly code 410 that match that semantics of the permutated rules 405 are shown. Note that a match will not necessarily be found for all of the permutated rules 405. After the matching process in complete, a set of mapping rules 415 suitable for the target architecture is generated.

Referring now to FIG. 3, the compiler generator can search the semantics-to-assembly database 335 to look for the aforementioned instruction semantics 408 that match the semantics 406 in the permutated rules 405. As previously discussed, parsing the target architecture description 120 may create the semantics-to-assembly database 335. Database 340 stores the mapping rules 415, which are suitable for use by the compiler 180.

In one-to-one mapping, the generator tries to find instructions (in the target architecture) directly mapped to the rules generated from the basic library. Nevertheless, the one-to-one mapping is not always successful because a target processor might not be able to perform some operations required by a compiler. For example, a network protocol processor might have no multiplication instructions, which are rarely used in network package processing. In such cases, one-to-many mapping of source code operations to machine instructions is used.

One-to-Many Mapping

During one-to-many mapping generation, the generator tries to map source code operations to sequences of machine instructions. However, because the performance of using multiple machine instructions is normally inferior to that of using single machine instruction, one-to-many mapping is typically used when the generator fails to find a one-to-one mapping for the operation.

Since the generator selects suitable machine instructions based on the semantics statements associated with the tree patterns, it is important to know what semantics substitutes can be used without affecting the result of computation. For this purpose, semantics transformation is introduced into the mapping rule generator. A semantics transformation specifies a sequence of semantics statements that together perform the same computation carried out by the original statement.

FIG. 5 illustrates an example of a semantic transformation, in accordance with an embodiment of the present invention. In this case, the unmapped rule 502 involves the NEG micro-operator. The unmapped rule 502 may be a rule from the basic library (FIG. 3, 325) for which no semantic match was found in the semantics-to-assembly database 335. The _NEG micro-operator represents a two's complement negation. The transformation 505 provides a mathematically equivalent solution for the NEG micro-operator as the operation-complement (_NOT) and addition of one. The _NOT micro-operator stands for one's complement. The semantic transformation 505 may be stored in a semantics transformation library (FIG. 3, 330). Applying the semantic transformation 505 allows the generation of two mapped rules 510 with associated machine instructions 515.

If the generator fails to find an instruction in the target architecture that performs negation, this semantic transformation 505 can help the generator look for two instructions to do a complement and an addition operation in sequence. In principle this approach can lower any operation only if an equivalent form exists and can be expressed in form of semantics statements.

As previously discussed, an embodiment of the present invention provides a semantic transformation library, which is a set of commonly used semantic transformations. The semantic transformation library, as well as the basic library, is user-extensible. As an example, a user extension may be added to the semantic transformation library if a source code operation needs to be implemented with a specific sequence of instructions.

Many-to-One Mapping

A working code selector description may be fully constructed with only one-to-one and one-to-many mapping, as previously discussed. Nevertheless, many processors implement instructions that can do several computations at a time, e.g., multiply-accumulate (MAC) instruction. These instructions are normally not needed for compilation, but using them can improve code quality. Therefore, an embodiment of the present invention provides many-to-one mapping.

In one-to-one and one-to-many mapping rule generation, tree patterns are generated from basic rules. However in many-to-one mapping, the operations that can be performed by special machine instructions are unpredictable. For example, designers can implement arbitrary operations in one instruction. As a result, it would be difficult for the generator to prepare tree patterns suitable for such instructions. Hence, for many-to-one mapping generation, the generator creates the tree pattern by analyzing the semantics of complex instructions.

In FIG. 6, an example of many-to-one mapping is provided using the MAC instruction, in accordance with an embodiment of the present invention. The semantics 620 of the instruction involves two micro-operators, _ADD and _MULII. The semantics statement 620 and the ASM 630 may be extracted from the target architecture model and stored in a semantics-to-assembly database. The _MULII operator represents signed integer multiplication. As these two micro-operators both correspond to unique compiler IR nodes, the generation of the tree pattern 610 is a one-to-one translation from micro-operators to IR nodes 640*a*, 640*b*. In the example, mirPlus 640*a* is the IR node corresponding to _ADD, and mirMult 640*b* maps to the _MULII operator. Given the tree pattern 610, a many-to-one mapping rule is generated, which utilizes the MAC instruction 630.

Thus, a compiler generator in accordance with an embodiment of the present invention takes into account not only mapping rules for a working code selector, but also rules that can improve code quality. The basic rules and semantic transformations, provided by default, help the generator create rules that are common to different processors. And architecture specific features are explored through two mechanisms, the user extensible libraries (e.g., basic and semantic transformation) and automatic many-to-one mapping generation. The libraries may be in text format to facilitate easy extension of the compiler generator for future processors.

FIG. 7 illustrates steps of a computer-implemented process 700 of automatically generating a description of compiler code selector rules from semantic information extracted from a target architecture model, in accordance with an embodiment of the present invention. In step 710, semantic information and assembly syntax is extracted from a target architecture model written in an architecture description language (ADL). In step 720, the extracted assembly syntax is associated with the extracted semantic information and stored in a database. For example, the semantic information comprises a number of semantic statements, with appropriate assembly syntax associated with each semantic statement.

In step 730, nonterminals are extracted from the target architecture model. In step 740, basic rules that map from source code operations to semantic patterns are accessed. In step 750, the basic rules are permuted based on the extracted nonterminals to form set of permuted mapping rules.

In step 760, semantics of the permuted mapping rules are matched to the extracted semantic information. For example, the database created in step 720 is searched for semantic statements or patterns that match semantic statements or patterns in the permuted mapping rules. The result of this searching and matching is a set of mapping rules that serve as a description of code selector rules.

It may be that the search of the database does not find a semantic match for some of the semantic patterns in the permuted rules. To handle these, as yet unmapped rules, steps 770, 775, and 780 are performed. In step 770, a library of pre-defined semantic transformations is accessed. The semantic transformations are operable to map one semantic statement to multiple semantic statements. In other words, the semantic transformations are able to determine at least two of the semantic statements in the extracted semantic information that are substantially equivalent to a single semantic pattern in the rules.

In step 780, semantic transformations are created of selected semantic information in the database to achieve semantic matches for permuted rules that are as yet unmapped. In other words, at least semantic statements in the database of extracted semantic information are found that are substantially equivalent to a single semantic pattern in an unmapped rule. In step 780, the as yet unmapped permuted mapping rules are matched to the just created semantic transformations. Thus, semantic matches are found for all rules. In this fashion, a complete description of compiler code selector rules is formed.

In optional step 790, analyzing the semantics of complex instructions in database creates a tree pattern for a new rule. This allows a many-to-one mapping, as previously discussed herein.

Simulator Generation

Figure 9:
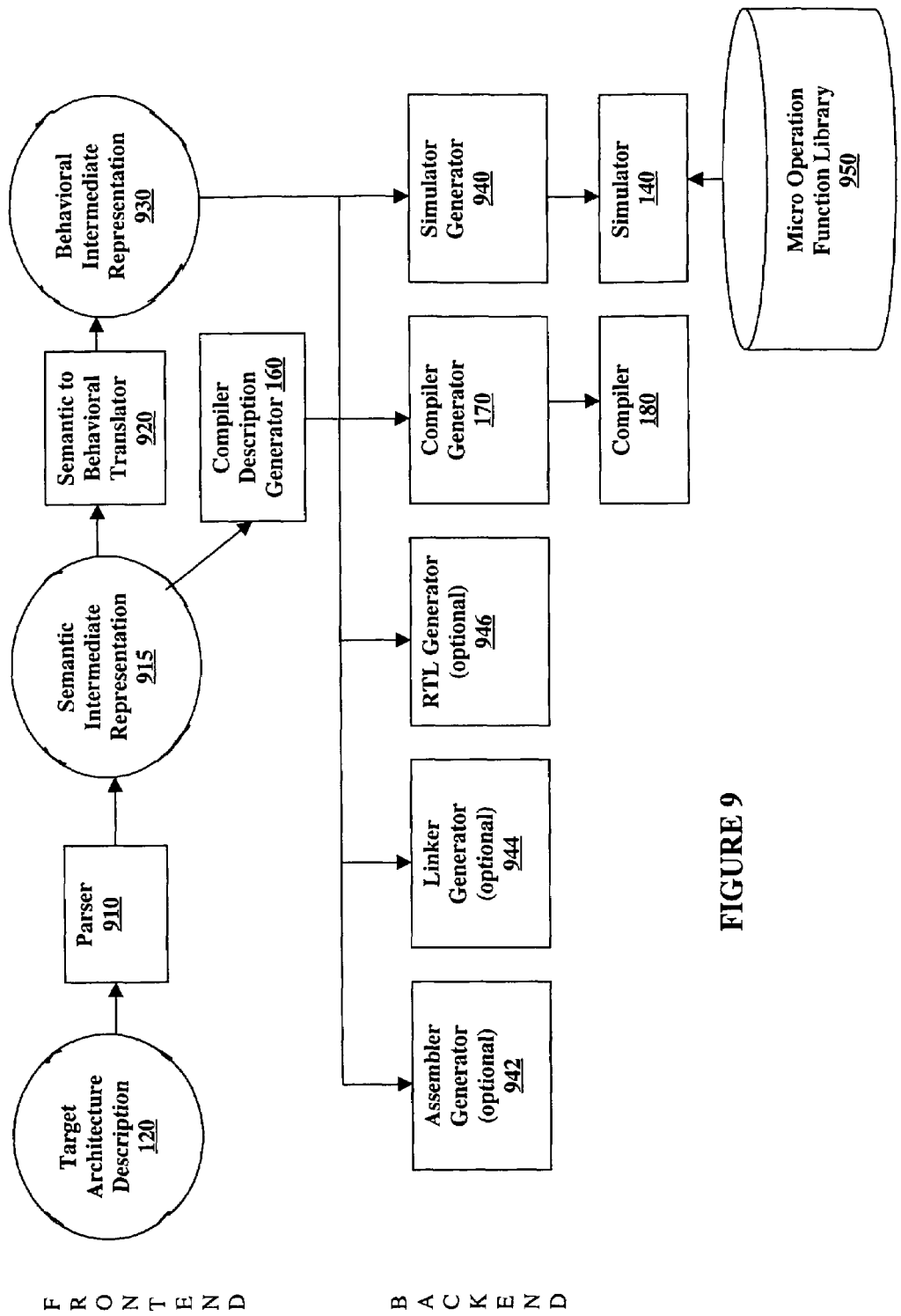
FIG. 9 shows a block diagram of simulator generation from a semantic instruction-set description, in accordance with an embodiment of the present invention.

Embodiments of the present invention automatically generate a simulator from a target architecture description. FIG. 9 shows a block diagram of simulator generation from a semantic instruction-set description, in accordance with an embodiment of the present invention. The parser 910 extracts semantic intermediate information (IR) 915 (e.g., a semantic instruction-set description) from the target architecture description 120. The semantic IR 915 may comprise a number of semantic descriptions of instructions. The SEMANTICS-to-BEHAVIOR translator 920, translates each SEMANTICS section into one or more BEHAVIOR sections to generate a behavioral IR 930. The translator can be understood as a lowering engine operating on the semantic intermediate representation of the target architecture description, wherein the abstract semantic IR is transformed into a behavioral IR. The behavioral IR may be described in the C programming language, although this is not required.

The semantic IR 915 may be input to a compiler description generator 160, in accordance with embodiments of the present invention, to automatically generate a compiler description, which may be input to the compiler generator 170.

The behavioral IR may be input to a variety of software tool generators to automatically generate a variety of software tools. Note that the semantic to behavioral translation is performed on the front-end. Thus, this embodiment of the present invention is compatible with existing backend software generation tools. For example, the behavioral IR 930 may be used to generate interpretive, compiled, or just-in-time cache-compiled simulators. In one embodiment, the simulator generator 940 is implemented by a just-in-time cache-compiled simulator (JIT-CC™ simulator) available from CoWare Corporation of San Jose, Calif., which is suitable to automatically generate a simulator 140 from the behavioral IR 930. Details of a just-in-time cache-compiled simulator are described in U.S. patent application Ser. No. 10/309,554, to Nohl, et al., entitled, "METHOD AND SYSTEM FOR INSTRUCTION-SET ARCHITECTURE SIMULATION USING JUST IN TIME COMPILATION," and assigned to the assignee of the present application. Said application is hereby incorporated by reference in its entirety.

The behavioral IR 930 may optionally be used as an input to other software generation tools, such as an assembler generator 942, linker generator 944 and an RTL (Register Transfer Level) generator 946.

The micro-operation function library 950 comprises a mapping of micro-operations usable to describe instruction in semantic statements to functions that are invokable by the simulator. Thus, the library 650 has a mapping of micro-operations to a functional description for the micro-operations. The functions are compliant with the C programming language in one embodiment.

Table X depicts an exemplary translation from semantic description of an instruction to a behavioral description of the instruction, in accordance with an embodiment of the present invention. The behavioral description may be used in the automatic generation of a simulator.

TABLE X

```
SEMANTICS {
    _ADDI[_Z,_C] ( Rs1<4..7>, Rs2<20..23> ) -> Rd<5..8>;
}
BEHAVIOR {
    Rd = ( Rd & (~BITMASK(5,4)) ) I
        ( BIT_EXTRACT
            ( SEM_ADD    (Rs1, 4, 4, /* op1 3-tuple */
                          Rs2, 20, 4, /* op2 3-tuple */
                          CARRY_FLAG | ZERO_FLAG
                ),
            0, 4 /* result is also a 3-tuple */
        ) << 5
    );
}
```

The SEMANTICS section in the Table X is for a target architecture that has an instruction-set designed to operate on bit-fields instead of entire registers only. The BEHAVIOR section shows the result of the translation. In this embodiment, the semantic statements comprise micro-operations, as described herein. Each micro-operation in a SEMANTICS statement is translated into a function call that is able to implement the function associated with the micro-operation. The implementation (e.g., C code) of functions is provided in a micro-operation function library (FIG. 9, 950), which can be either inlined or eventually linked to the resulting simulator. Furthermore, the micro-operation itself also represents a 3-tuple (SEM ADD, 0, 4), which facilitates an implementation of chaining.

In Table X, the micro-operation _ADDI in the SEMANTICS section is translated into a call to a SEM_ADD function in the BEHAVIOR section. The SEM_ADD function takes three parameters: two 3-tuple operands (Rs1, 4, 4) and (Rs2, 20, 4), and a specification of the affected flags resulting from the contents of the square brackets following the micro-operation.

The assignment from (SEM ADD, 0, 4) to (Rd, 5, 4) employs a number of bit-manipulation operations, as bitwise and (&), or (I), negate (~), shift (<<), and few macros as BITMASK and BIT EXTRACT. The macros are defined in the micro-operation library, such that they are available for the simulator. The purpose of these bit-manipulations and macros includes converting aspects of the semantic statement into a format that is compatible with the language (e.g., C) of the behavioral section (and ultimately the language in which the functions in the micro-operation library are implemented).

Complex Operations

Not all semantic statements can be translated as simply as the example in Table X. As described in Table V herein, two or more micro-operations in a semantic statement may be chained. For such chained micro-operations, the translation from a semantic section to a behavioral section can be achieved with nested function calls. As further described in Table V herein, two or more micro-operations may be used in parallel. A semantic section with parallel micro-operations can be translated to a behavior section by using clock-sensitive register types instead of simple variables (e.g., C variables).

Table XI depicts a semantic statement having a micro-operation that can be passed parameters. In this example, the GROUP statement in line 3 has a number of arithmetic operators, which may be passed as parameters to the SEMANTICS statement in lines 4-5.

TABLE XI

```
1   OPERATION arithmetic {
2     DECLARE {
3       GROUP ArithOp = { ADD I SUB I MUL I . . . };
4     SEMANTICS {
5       ArithOp ( Rs1, Rs2 ) -> Rd;}}
6
7   OPERATION ADD {
8     SEMANTICS { _ADDI }}
9
10  OPERATION SUB {
11    SEMANTICS { _SUBI }}
12
13  OPERATION MUL {
14    SEMANTICS { MULI }}
15
16  OPERATION arithmetic {
17    DECLARE {
18      GROUP ArithOp = { ADD I SUB I MUL I . . . };
19    SWITCH (ArithOp) {
20      CASE ADD: { SEMANTICS { _ADDI ( Rs1, Rs2 ) -> Rd; }}
21      CASE SUB: { SEMANTICS { _SUBI ( Rs1, Rs2) -> Rd; }}
22      CASE MUL: { SEMANTICS { _MULU ( Rs1, Rs2 ) -> Rd; }}}}
```

In this example, the operation "arithmetic" in lines 1-5 and the operations ADD, SUB, and MUL in lines 7-14 are translated into a single operation "arithmetic" in lines 16-22. In so doing, a single semantic statement in lines 4-5, is translated into three semantic statements in lines 20-22 making use of a SWITCH/CASE control flow statement and the operations in lines 7-14.

In order to generate the corresponding BEHAVIOR sections from the semantic description in lines 1-14, the operations "arithmetic", ADD, SUB, and MUL are first translated into an equivalent representation still employing SEMANTICS sections. This is achieved by completely removing the SEMANTICS section from operation ADD, and rewriting the operation "arithmetic" into the operation shown in lines 16-22. A similar process is employed for the operations SUB (lines 10-11) and MUL (lines 13-14). The SWITCH/CASE statement in lines 19-22 evaluates the GROUP in line 18, and thus selects only one of the three SEMANTICS sections depending on the operation chosen. This way, the non-terminal micro-operation call has been removed. The individual SEMANTICS sections in lines 20-22 may be translated into BEHAVIOR sections as described herein. For example, micro-operators can be translated to function calls.

Intrinsic Micro-Operations

An embodiment of the present invention allows an intrinsic micro-operation to be defined. Such an intrinsic micro-operation may be user-defined for a special case in which the user either does not desire to use the pre-defined micro-operations or the micro-operations are unable to describe the instruction. This is typically used for complex instructions that are not easily described with the pre-defined semantic micro-operators. An exemplary SEMANTICS section and the generated BEHAVIOR section for an FFS (find first set bit) instruction are shown in Table XII.

TABLE XII

```
OPERATION FFS {
  SEMANTICS {
    "_FFS" ( Rs, ZeroOrOne, FromLeftOrRight ) -> Rd; }}
  BEHAVIOR { /* Generated from the above */
    Rd = SEM_FFS(Rs, ZeroOrOne, FromLeftOrRight);
```

The quotation marks around "FFS" indicate an intrinsic micro-operation. From the BEHAVIOR section generated in accordance with an embodiment of the present invention, it can be seen that a C function or macro SEM_FFS should be implemented by the user and added to the micro operation library such that it is available for the simulator.

Rather than using an intrinsic micro-operation, the instruction "FFS" could be described in a behavior section. However, the intrinsic micro operation approach has at least two major advantages. It provides enough information for the compiler generator of one embodiment to automatically generate a compiler-known function. If the source code being compiled invokes a compiler-known function, the compiler can generate the associated instruction that was defined in the target architecture model. This may allow the compiled code to perform the function with single instruction rather than a complex sequence of instructions. Also, it avoids the need for BEHAVIOR section for this instruction, which is important when moving to cycle-accurate level.

Cycle Accurate Modeling and Simulation

In the examples provided in Table X-Table XII, only instruction-accurate (IA) models have been taken into consideration. The use of the SEMANTICS section obsoletes the need for a BEHAVIOR section for most operations, in accordance with embodiments of the present invention. For example, for instruction accurate simulation the user does not need to provide a behavioral description of the instruction set because the semantic description of the instruction set is sufficient for embodiments of the present invention to automatically generate an instruction accurate simulator. Moreover, a compiler can be automatically generated by the same semantic description, in accordance with embodiments of the present invention. Therefore, the target architecture modeling effort is substantially reduced due the presence of a micro-operation library. Moreover consistency is maintained as the same model can be used for automatic generation of the instruction accurate simulator and the compiler.

To automatically generate a cycle accurate (CA) simulator, an embodiment of the present invention uses a behavioral section that provides information at the cycle accurate abstraction level. However, the same target architecture model may be used for the automatic generation of both the instruction accurate simulator and the cycle accurate simulator. The instruction accurate simulator is automatically generated from the semantic section of the model and the cycle accurate simulator is automatically generated from the behavior section of the model. Note that the semantic section and the behavior section describe and co-exist in the same model, but at different levels of abstraction. This avoids the need for two separate target architecture models for generation of an instruction accurate simulator and a cycle accurate simulator, as in known prior art techniques.

Table XIII shows the implementation of an ADD operation from Table X in a cycle accurate model. The first line of the example indicates that the operation only describes behavior of ADD in the execute (EX) stage of a pipeline. From the content of the BEHAVIOR section, two observations are noticeable. It would be extremely difficult to extract the instruction semantics from a cycle-accurate behavior description. It is impossible to generate a cycle-accurate behavior description from a specification of the instruction semantics without assuming a fixed microarchitecture.

TABLE XIII

```
OPERATION ADD IN pipe.EX {
   DECLARE {
      INSTANCE writeback;
      GROUP src1, dst = { reg };
      GROUP src2 = { reg II imm };}
   SYNTAX { "addc" dst "," src1 "," src2 }
   SEMANTICS { __ADDI[__C](src1, src2) -> dst; }
   BEHAVIOR {
      u32 op1, op2, result, carry;
      u1 c;
      if (forward) {
         op1 = PIPELINE__REGISTER(pipe,EX/WB).result;}
      else {
         op1 = PIPELINE__REGISTER(pipe,DC/EX).op1;}
      result = op1 + op2;
      carry = compute__carry(op1, op2, result);
      PIPELINE__REGISTER(EX/WB).result = result;
      PIPELINE__REGISTER(EX/WB).carry = carry; }
   ACTIVATION { writeback, carry__update }}
```

A difference between cycle accurate and instruction accurate models is made up by the way the behavior of an instruction is described. In an instruction accurate model, each instruction is self-contained, which means it is assumed to have completed execution and written its results before the next instruction is decoded. In contrast, in a cycle accurate model, instruction execution might be interleaved, for instance, by means of an instruction pipeline. Hence, the behavioral description of an instruction may be distributed over several operations, which are potentially executed at different clock cycles. Each of such operations obtains the result from the previous operation, possibly performs a computation, and passes its results to the next operation.

Therefore, in order to generate compiler and cycle accurate simulator from a single model, a small amount of redundancy may be incorporated into the description. For example, the semantic section describes the same instruction as the behavior section. However, this relatively small redundancy allows bi-abstract models, in accordance with embodiments of the present invention.

Bi-Abstract Models

Embodiments of the present invention provide for bi-abstract models that describe a single target processor architecture on two abstraction levels at the same time, namely instruction- and cycle-accuracy. This avoids the need to maintain two separate models. Maintaining two separate models leads to inconsistency and increases maintenance cost eventually impairing the benefits of an ADL-based design approach.

Referring again to Table XIII, abstract semantics and microarchitecture behavior co-exist, while syntax and coding (not depicted in Table XIII) are only described once. Furthermore, embodiments of the present invention automatically generate an instruction accurate simulator from the information contained in the SEMANTICS section. Thus, for instruction accurate simulator generation, the existing (cycle accurate) behavior description captured in BEHAVIOR and ACTIVATION sections can be ignored. The instruction accurate simulator may be generated from the translated SEMANTICS sections, in accordance with an embodiment of the present invention. A cycle accurate simulator is automatically generated from the existing BEHAVIOR and ACTIVATION sections, in accordance with an embodiment of the present invention, while ignoring all SEMANTICS sections in the model. However, as discussed herein, the very same model (with the semantic section and the behavior section co-existing at different abstraction levels) can be used to generate both the instruction accurate simulator and the cycle accurate simulator, in accordance with an embodiment of the present invention.

Functional Units

The SEMANTICS formalism is intended to be used for the description of instructions, while the functional description of components that are not part of the instruction-set, for example, a fetch unit, can still employ BEHAVIOR sections. The functional unit may behave differently for the instruction accurate case than the cycle accurate case. One approach to handling the different behavior of functional units on different abstraction levels it to employ preprocessor defines to make either the instruction accurate BEHAVIOR section or the cycle accurate BEHAVIOR section visible to the automatic tool generators, in accordance with an embodiment of the present invention. Alternatively, a functional unit may be described at different abstraction levels by pre-defined components. A parameter may be passed in a behavior section, for example, to select which of two pre-defined components (instruction accurate or cycle accurate) is used.

Exemplary Processes

Figure 10:
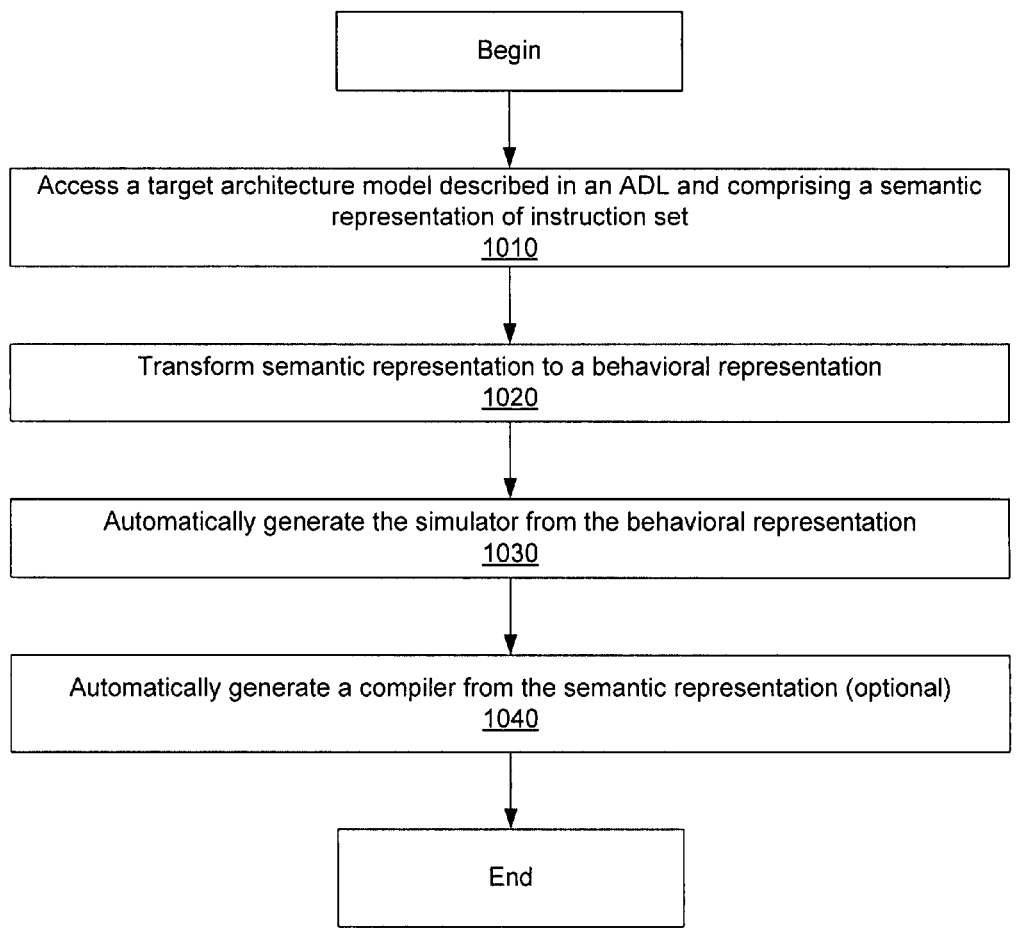
FIG. 10 is a flowchart illustrating steps of a process of automatically generating a simulator from an architecture description, in accordance with an embodiment of the present invention.

FIG. 10 is a flowchart illustrating steps of a computer-implemented process 1000 of automatically generating a simulator from an architecture description, in accordance with an embodiment of the present invention. In step 1010, a target architecture model described in an architecture description language (ADL) is accessed. The model comprises a semantic representation of an instruction set for the target architecture. The semantic representation may comprise semantic statements having micro-operations that are able to describe instructions. A library that maps the micro-operations to function calls is provided by an embodiment of the present invention. The user may define intrinsic micro-operations by adding a function to the library, wherein the function implementing the micro-operation is invokable by the simulator. In one embodiment, a semantic statement that receives one of a plurality of passed parameters is translated into a plurality of semantic statements corresponding to the parameters.

In step 1030, each of the semantic statements is transformed to a behavioral representation. Step 1030 may include translating micro-operations in the semantic statements to function calls in the behavioral representation. Moreover, step 1030 may comprise converting the semantic information into a format that is compatible with a programming language of functions used by the simulator.

In step 1040, the simulator is automatically generated from the behavioral representation.

In optional step 1050, a compiler is automatically generated from the semantic representation. Process 1000 then ends.

Figure 11:
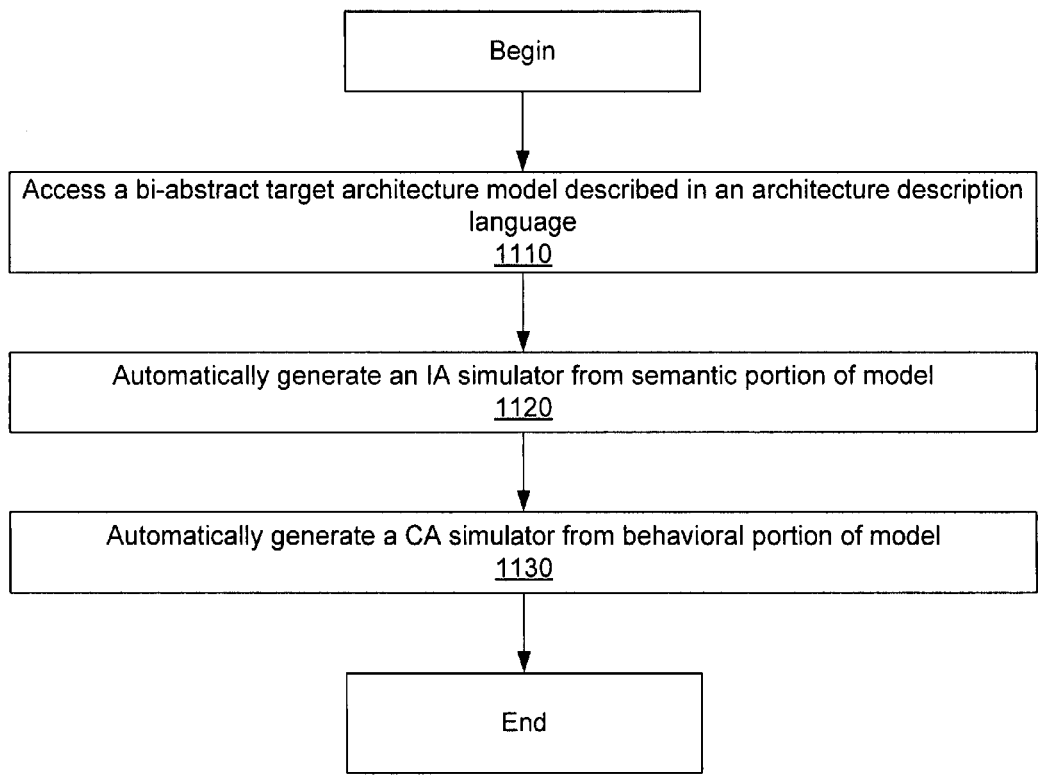
FIG. 11 is a flowchart illustrating steps of a process of automatically generating simulators on different abstraction levels from a common target architecture model, in accordance with an embodiment of the present invention.

FIG. 11 is a flowchart illustrating steps of a process 1100 of automatically generating simulators at different abstraction levels from the same target architecture model. In step 1110, a bi-abstract target model comprising a semantic description of an instruction set and a behavioral description of the instruction set is accessed. The semantic and behavioral descriptions describe the same target architecture model at different abstraction levels and co-exist in the model. The semantic description may comprise an instruction accurate model and the behavioral description may comprise a cycle accurate model.

In step 1120, an instruction accurate simulator is automatically generated from the semantic description. Step 1120 may comprise transforming the semantic description to a behavioral representation and automatically generating the simulator from the behavioral representation.

In step 1130, a cycle accurate simulator is automatically generated from the behavioral description. Process 1100 then ends.

Exemplary Computer System Platform

Figure 8:
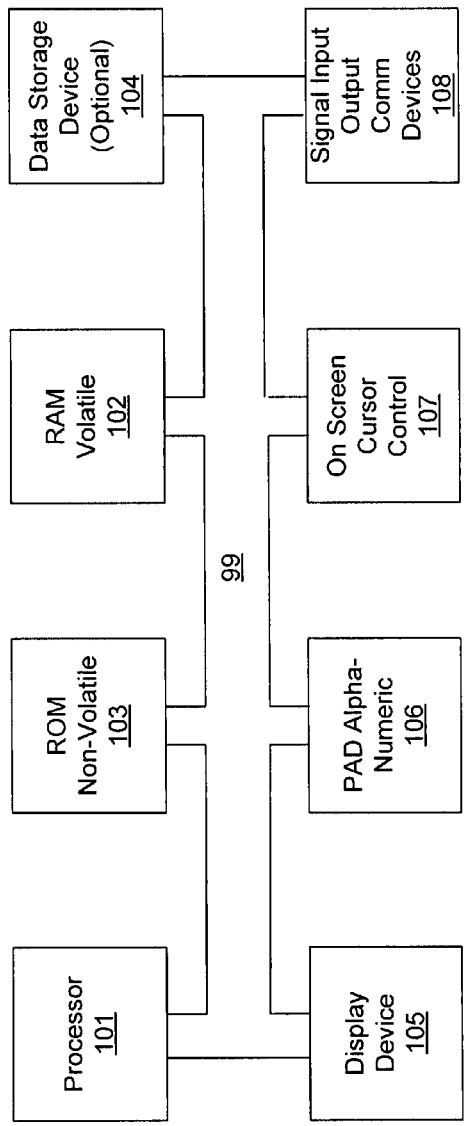
FIG. 8 is an exemplary computer system that may serve as a platform upon which embodiments of the present invention may be executed.

FIG. 8 illustrates circuitry of an exemplary computer system 100, which may form a platform for embodiments of the present invention. The compiler description generator 160, the compiler 180, Ipacker 184, and assembler/linker, as well as the compiler generator 170 may also be implemented using computer system 100. The parser 910, the semantic to behavioral translator 920 and the simulator generator 940 may be implemented by computer system 100. The micro-operation function library (FIG. 9, 950) and databases 330, 335, and 340 in FIG. 3 may be stored in any of the computer readable media of computer system 100.

Computer system 100 includes an address/data bus 99 for communicating information, a central processor 101 coupled with the bus for processing information and instructions, a volatile memory 102 (e.g., random access memory RAM) coupled with the bus 99 for storing information and instructions for the central processor 101 and a non-volatile memory 103 (e.g., read only memory ROM) coupled with the bus 99 for storing static information and instructions for the processor 101. Computer system 100 also includes an optional data storage device 104 (e.g., a magnetic or optical disk and disk drive) coupled with the bus 99 for storing information and instructions.

With reference still to FIG. 8, system 100 may also include an alphanumeric input device 106 including alphanumeric and function keys coupled to bus 99 for communicating information and command selections to central processor unit 101. System 100 may also include a cursor control device 107 coupled to bus 99 for communicating user input information and command selections to central processor unit 101. System 100 of the present embodiment may also include a display device 105 coupled to bus 99 for displaying information. A signal input/output communication device 108 coupled to bus 99 provides communication with external devices.

The preferred embodiments of the present invention are thus described. While the present invention has been described in particular embodiments, it should be appreciated that the present invention should not be construed as limited by such embodiments, but rather construed according to the below claims.

What is claimed is:

1. A computer-implemented method of generating a simulator, comprising:
   accessing a target architecture model described in an architecture description language (ADL), said model comprising a semantic representation of an instruction set executable on said target architecture;
   transforming said semantic representation to a behavioral representation; and
   automatically generating said simulator from said behavioral representation.

2. A method as recited in claim 1, wherein said transforming comprises translating micro-operations in said semantic representation to function calls in said behavioral representation.

3. A method as recited in claim 2, wherein said transforming further comprises accessing a library of mappings of micro-operations usable in said semantic representation to function calls invokable by said simulator.

4. A method as recited in claim 1, further comprising automatically generating a compiler description from said semantic representation.

5. A method as recited in claim 1, wherein said model further comprises a behavioral description describing said instruction set at a different abstraction level from said semantic representation and co-existing with said semantic representation in said model,
   wherein further said automatically generating said simulator comprises generating an instruction accurate simulator, and
   further comprising automatically generating a cycle accurate simulator from said behavioral description.

6. A method as recited in claim 1, further comprising converting said semantic representation into a format that is compatible with a programming language of functions invoked by said simulator.

7. A method as recited in claim 1, further comprising converting said semantic representation into a format that is compatible with a programming language in which said behavioral representation is implemented.

8. A method as recited in claim 1, further comprising translating a semantic statement in said semantic representation that receives one of a plurality of passed parameters into a plurality of semantic statements corresponding to said parameters.

9. A computer readable medium having stored thereon instructions for implementing a method of generating a simulator, said method comprising:
   accessing a target architecture model described in an architecture description language (ADL), said model comprising a semantic representation of an instruction set executable on said target architecture;
   transforming said semantic representation to a behavioral representation; and
   automatically generating said simulator from said behavioral representation.

10. A computer readable medium as recited in claim 9, wherein said transforming comprises translating micro-operations in said semantic representation to function calls in said behavioral representation.

11. A computer readable medium as recited in claim 10, wherein said transforming further comprises accessing a library of mappings of micro-operations usable in said semantic representation to function calls invokable by said simulator.

12. A computer readable medium as recited in claim 9, wherein said method further comprises automatically generating a compiler description from said semantic representation.

13. A computer readable medium as recited in claim 9, wherein said model further comprises a behavioral description describing said instruction set at a different abstraction level from said semantic representation and co-existing with said semantic representation in said model,
   wherein further said automatically generating said simulator comprises generating an instruction accurate simulator, and
   wherein said method further comprises automatically generating a cycle accurate simulator from said behavioral description.

14. A computer readable medium as recited in claim 9, wherein said method further comprises converting said semantic representation into a format that is compatible with a programming language of functions invoked by said simulator.

15. A computer readable medium as recited in claim 9, wherein said method further comprises converting said semantic representation into a format that is compatible with a programming language in which said behavioral representation is implemented.

16. A computer readable medium as recited in claim 9, wherein said method further comprises pre-processing said target architecture model to pass a behavioral section at a desired abstraction level and block a behavioral section at an undesired abstraction level.

17. A computer implemented method of automatically generating simulators at different abstraction levels, said method comprising:
   accessing a bi-abstract target model comprising a semantic description of an instruction set and a behavioral description of the instruction set executable on said target model, wherein the semantic description and the behavioral description describe the instruction set at different abstraction levels and co-exist in said model;
   automatically generating an instruction accurate simulator from said semantic description; and
   automatically generating a cycle accurate simulator from said behavioral description.

18. A computer implemented method as recited in claim 17, wherein said semantic description comprises an instruction accurate model and said behavioral description comprises a cycle accurate model.

19. A computer implemented method as recited in claim 17, wherein said automatically generating the instruction accurate simulator from said semantic description comprises:
   transforming said semantic description to a behavioral representation; and
   automatically generating said instruction accurate simulator from said behavioral representation.

20. A computer implemented method as recited in claim 17, further comprising automatically generating a compiler description from said semantic description.

21. A computer implemented method as recited in claim 17, wherein said semantic description comprises micro-operations that are operable to describe instructions and wherein said automatically generating the instruction accurate simulator comprises accessing a library of mappings of said micro-operations to function calls invokable by said instruction accurate simulator.

22. A computer implemented method as recited in claim 17, further comprising converting said semantic description into a format that is compatible with a programming language in which functions invokable by said instruction accurate simulator are written.

* * * * *